US006781411B2

United States Patent
Steiss et al.

(10) Patent No.: US 6,781,411 B2
(45) Date of Patent: Aug. 24, 2004

(54) FLIP FLOP WITH REDUCED LEAKAGE CURRENT

(75) Inventors: Donald E. Steiss, Richardson, TX (US); Clive Bittlestone, Lucas, TX (US); Peter Cumming, La Gaude (FR); Christopher Barr, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 10/256,302

(22) Filed: Sep. 27, 2002

(65) Prior Publication Data

US 2003/0141911 A1 Jul. 31, 2003

(30) Foreign Application Priority Data

Jan. 29, 2002 (EP) .............................................. 02290204

(51) Int. Cl.[7] ...................... H03K 19/173; H03K 19/00; H03K 3/289
(52) U.S. Cl. .............................. 326/46; 326/94; 327/202
(58) Field of Search ................................ 326/46, 93–96, 326/16; 327/202–203; 713/320, 324; 365/226–229

(56) References Cited

U.S. PATENT DOCUMENTS

| | | | |
|---|---|---|---|
| 5,250,852 A | | 10/1993 | Ovens et al. |
| 5,612,632 A | | 3/1997 | Mahant-Shetti et al. |
| 5,712,584 A | * | 1/1998 | McClure ...................... 327/198 |
| 6,275,083 B1 | * | 8/2001 | Martinez et al. ............ 327/218 |
| 6,433,586 B2 | * | 8/2002 | Ooishi .......................... 326/93 |

* cited by examiner

Primary Examiner—James H. Cho
(74) Attorney, Agent, or Firm—Robert D. Marsahll, Jr.; W. James Brady, III; Frederick J. Telecky, Jr.

(57) ABSTRACT

A flip flop (30) comprising a master stage (34) comprising a first plurality of transistors (54, 56), wherein each of the first plurality of transistors comprises a selective conductive path between a source and drain. The flip flop also comprises a slave stage (42) comprising a second plurality of transistors (60, 62, 64, 66), wherein each of the second plurality of transistors comprises a selective conductive path between a source and drain. For the flip flop, in a low power mode the flip flop is operable to receive a first voltage ($V_{DD}$) coupled to the selective conductive path for each of the first plurality of transistors. Also in the low power mode, the flip flop is operable to receive a second voltage ($V_{DDL}$) coupled to the selective conductive path for each of the second plurality of transistors. Lastly, the second voltage is greater than the first voltage in the low power mode.

44 Claims, 3 Drawing Sheets

FLIP FLOP WITH REDUCED LEAKAGE CURRENT

This application claims priority to European Application Serial No. 02290204.3, filed Jan. 29, 2002 (TI-31098EU).

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuitry and are more particularly directed to a flip flop with reduced leakage current.

A clocked flip-flop utilizes sequential logic to selectively latch one of two binary states, a logic "0" or a logic "1". A D flip-flop inputs a binary data input D and in response to clock transitions thereafter outputs D at a binary data output Q. Typical flip-flops of this type use a master and a slave section with the master section initially clocked on one level of a clock signal to store the logic state from input D on a master node, and then, on the next level of the clock, to transfer this logic state to a slave node for storage and also to output it on the Q output. In this manner, on the next clock cycle, another logic state can be stored on the master node without affecting the slave node.

Figure 1:
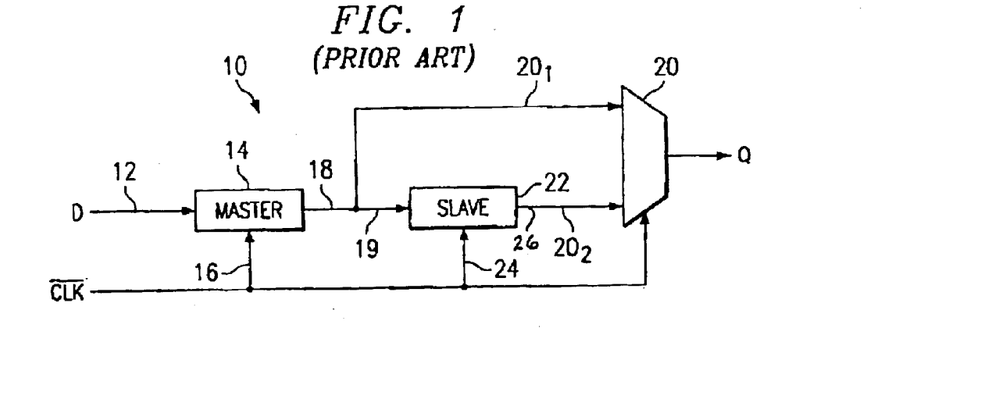
FIG. 1 illustrates an electrical block diagram of a prior art flip flop.

By way of further background, U.S. Pat. No. 5,250,852 (hereafter, the '852 Patent) is entitled "Circuitry And Method For Latching A Logic State," issued on Oct. 5, 1993, and is hereby incorporated herein by reference. The '852 Patent illustrates two alternative flip-flops (see FIGS. 1 and 2 thereof), with FIG. 1 of the present application introducing the implementation of FIG. 1 in the '852 patent so as to further appreciate both the prior art and the preferred embodiments described below. Turning to FIG. 1, it illustrates an electrical block diagram of a prior art flip flop 10. Flip flop 10 receives data D at a data input 12 to a master circuit 14, and master circuit 14 also receives a clock signal $\overline{CLK}$ at a clock input 16. The use of $\overline{CLK}$ rather than its complement (i.e., CLK) is simply to maintain consistency with the '852 patent, where one skilled in the art will appreciate that comparable operation could be achieved based on a complementary clock signal using the appropriate connections and circuitry within flip flop 10. The output of master circuit 14 is connected to master output node 18, and master output node 18 is connected to a data input 19 of a slave circuit 22. Slave circuit 22 also receives the clock signal $\overline{CLK}$ at a clock input 24. Returning to master output node 18, it is also connected to a first input $20_1$ of a multiplexer 20. A second input $20_2$ of multiplexer 20 is connected to a slave output node 26. The output of multiplexer 20 provides the Q output of flip flop 10, as further appreciated from the operational description provided below.

Figure 2:
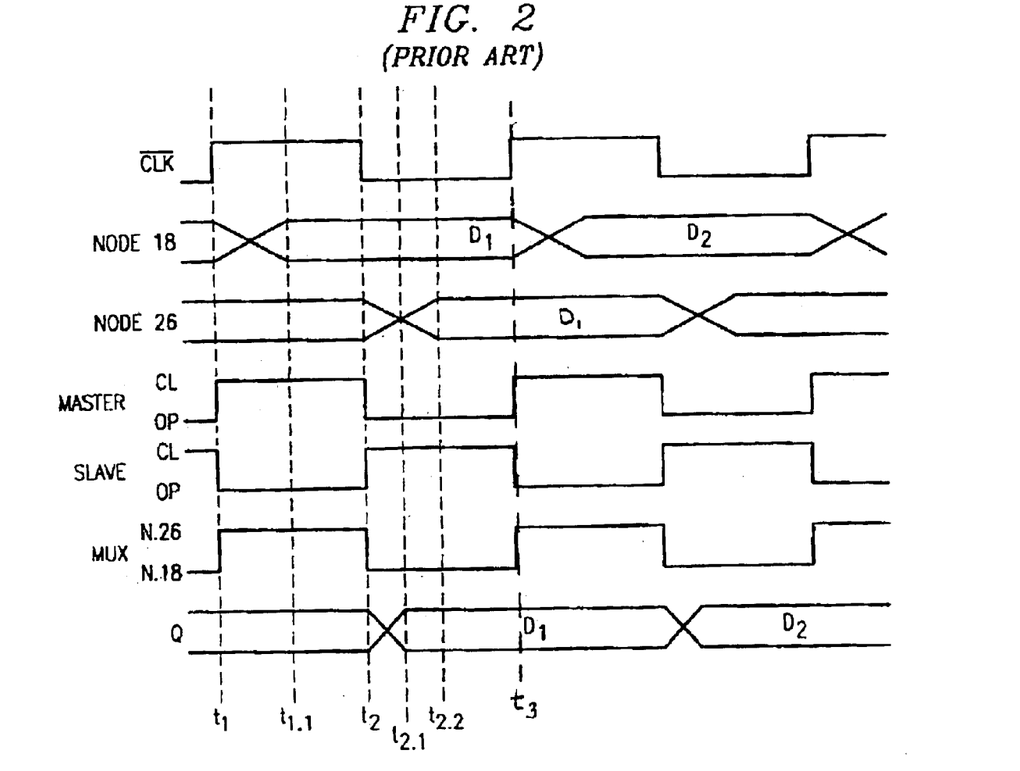
FIG. 2 illustrates a timing diagram of various signals in connection with the flip flop of FIG. 1.

FIG. 2 illustrates a timing diagram of various signals in connection with the prior art flip flop 10 of FIG. 1, and the operation of flip flop 10 is now described in connection with those signals. In general, data D from input 12 is clocked through flip flop 10 and provided at the Q output. To illustrate this operation, assume data D at a time $t_1$ is represented by $D_1$, and the following discussion traces the passage of $D_1$ through flip flop 10. At $t_1$, $\overline{CLK}$ transitions from low to high, and this transition doses master circuit 14, that is, a conductive path is closed through master circuit 14 to pass data $D_1$ from input 12 to master output node 18. In this regard, master circuit 14 includes a transfer gate to perform this function and which is sometimes referred to with other terminology such as a passgate. Accordingly, after a certain delay associated with the devices of the conductive path through master circuit 14, and thus at a time $t_{1.1}$, $D_1$ is shown in FIG. 2 to appear at master output node 18. The state of $D_1$ is retained at master output node 18, typically by way of a latch circuit within master circuit 14. At $T_2$, $\overline{CLK}$ transitions from high to low, and this transition doses slave circuit 22, that is, a conductive path is dosed through slave circuit 22 to pass data $D_1$ from its input 19 to slave output node 26; similar to master circuit 14, slave circuit 22 typically includes a transfer gate to achieve this function. Accordingly, after a certain delay associated with the devices of the conductive path through slave circuit 22, and thus at a time $t_{2.2}$, $D_1$ is shown in FIG. 2 to appear at slave output node 26, where $D_1$ is typically retained by way of a latching circuit included within slave circuit 22. Notably, in addition to the closing of slave circuit 22, the low level following the transition of $\overline{CLK}$ at $t_2$ also causes multiplexer 20 to select the data at its input $20_1$, that is, multiplexer 20 selects the data from master output node 18. As a result, at a time $t_{2.1}$ that follows a multiplexer delay, the Q output of flip flop 10 provides $D_1$. As a noted benefit of this prior art approach, the multiplexer delay between $t_2$ and $t_{2.1}$ is shorter than the delay time between $t_2$ and $T_{2.2}$ as required for $D_1$ to pass through slave circuit 22. In other words, the output of flip flop 10 is valid sooner due to the use of multiplexer 20 as compared to other prior art approaches that provide the Q output as an output solely from the slave circuit. Another manner of stating this is with respect to what is referred to in the flip flop art as the clock-to-Q time for the flip flop, that is, the time required between the slave-closing clock transition (e.g., $t_2$) and the time the Q output is valid (i.e., $t_{2.1}$). For flip flop 10, this clock-to-Q parameter is shorter and, hence improved, as compared to the art that preceded the '852 patent.

To complete a discussion of one full clock period in FIG. 2, note that at time $t_3$ there is another low to high transition of $\overline{CLK}$. In response, master circuit 14 again closes to transfer the next data, $D_2$, to master output node 18; however, also in response to the high level after the transition of $\overline{CLK}$, multiplexer 20 switches to select its input $20_2$ and provides it at the Q output. Thus, at the same time that master circuit 14 is transferring $D_2$, $D_1$ is still available at slave output node 26, and since that node is connected to input $20_2$ of multiplexer 20 then at that time it is connected to the Q output. In other words, although the $t_3$ low to high transition of $\overline{CLK}$ once again closes master circuit 14, this does not affect the output of flip flop 10 because that output is then taken from slave output node 26 which remains unchanged in response to the $t_3$ $\overline{CLK}$ transition.

While the approach of the '852 patent provides an improved flip flop device, the present inventors have observed that such an approach may be improved still further with respect to power consumption. Specifically, the electronics industry is increasingly focused on reduction of power consumption in electronic circuits. Power is generally consumed by a circuit during active operation and also due to leakage, where the latter relates to the various conductive paths that are not fully enabled at a given time but which are nonetheless leaking current and thereby consuming energy. Leakage power is presently still smaller than active power, but leakage power has become a comparable issue due to the increasing importance of battery-powered devices. As a result, there is a focus in the industry to reduce both types of power consumption, including leakage power loss. For example, in the area of circuits in general, one approach is to identify times when operation is unneeded, and to reduce the active state of the device during that time. This modified state is often referred to as a certain mode, and includes various names such as reduced power mode, sleep mode, and various other terms used in the art. With respect to a flip flop in such a state, one approach has been to shift the data stored in the flip flop into a memory, and then powering down the entire flip flop until the reduced power mode is no longer desired. At that time, power is restored to the entire flip flop and the data is then shifted back from the memory to the flip flop. While such an approach has proven useful, it also has the drawback that it takes a considerable amount of time to restore the data to the flip flop. Accordingly, the present inventors endeavor through the preferred embodiments as described below to provide an alternative approach with respect to flip flop 10 as well as comparable devices, and to achieve a reduced amount of leakage power consumption for that device as compared to the prior art. Other benefits will be ascertainable by one skilled in the art.

BRIEF SUMMARY OF THE INVENTION

In the preferred embodiment, there is a flip flop. The flip flop comprises a master stage comprising a first plurality of transistors, wherein each of the first plurality of transistors comprises a selective conductive path between a source and drain. The flip flop also comprises a slave stage comprising a second plurality of transistors, wherein each of the second plurality of transistors comprises a selective conductive path between a source and drain. For the flip flop, in a low power mode the flip flop is operable to receive a first voltage coupled to the selective conductive path for each of the first plurality of transistors. Also in the low power mode, the flip flop is operable to receive a second voltage coupled to the selective conductive path for each of the second plurality of transistors. Lastly, the second voltage is greater than the first voltage in the low power mode. Other circuits, systems, and methods are also disclosed and claimed.

DETAILED DESCRIPTION OF THE INVENTION

FIGS. 1 and 2 were discussed in the earlier Background Of The Invention section of this document in connection with the prior art, and the reader is assumed familiar with the principles of that discussion.

Figure 3:
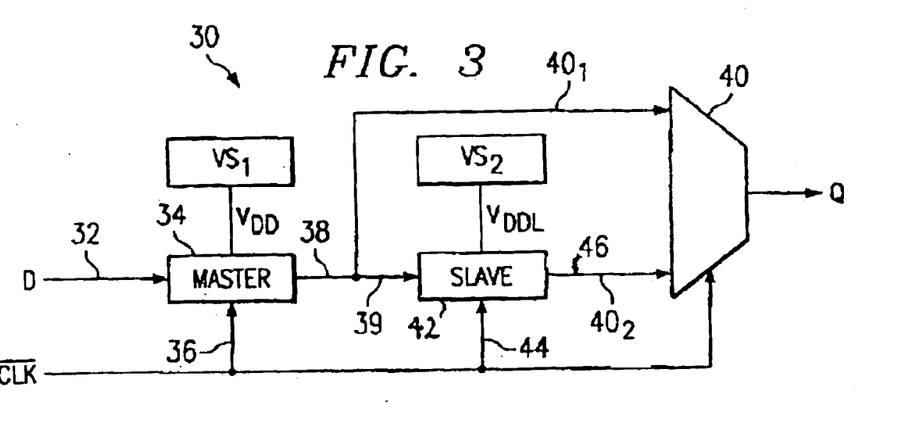
FIG. 3 illustrates an electrical block diagram of a preferred embodiment flip flop.

FIG. 3 illustrates an electrical block diagram of a preferred embodiment flip flop 30. Flip flop 30 receives data D at a data input 32 to a master circuit 34, and master circuit 34 also receives a clock signal $\overline{CLK}$ at a clock input 36. The use of $\overline{CLK}$ is only by example, and one skilled in the art will appreciate that comparable operation could be achieved based on a complementary clock signal (i.e., CLK) using the appropriate connections and devices within flip flop 30. The output of master circuit 34 is connected to master output node 38, and master output node 38 is connected to a data input 39 of a slave circuit 42. Slave circuit 42 also receives the clock signal $\overline{CLK}$ at a clock input 44. Returning to master output node 38, it is also connected to a first input $40_1$ of a multiplexer 40 by way of an inverter discussed below. A second input $40_2$ of multiplexer 40 is connected to a slave output node 46, also by way of an inverter discussed below. The output of multiplexer 40 provides the Q output of flip flop 30. From the preceding, one skilled in the art may appreciate that as described thus far, flip flop 30 resembles the above-described flip flop 10 in certain respects. However, with respect to power issues and also with respect to implementation, the two flip flops differ considerably, as described below.

Reference is now made to the power signals applied within flip flop 30 of the preferred embodiment. Specifically, a first power signal, $V_{DD}$, is applied to master circuit 34, while a second and different power signal, $V_{DDL}$, is applied to slave circuit 42. The addition of the "L" in the subscript of $V_{DDL}$ as compared to $V_{DD}$ is intended to demonstrate that $V_{DDL}$, during a power savings or low power mode referred to below as a standby mode, is less than $V_{DD}$ during an active mode, as detailed below. To further indicate this distinction, FIG. 3 also illustrates that $V_{DD}$ is provided by a first voltage source $VS_1$, while $V_{DDL}$ is provided by a second voltage source $VS_2$. One skilled in the art may ascertain various manners in which to implement these separate voltage sources. In any event, the two power signals $V_{DD}$ and $V_{DDL}$ are relative to some common lower potential which is not shown for sake of simplicity, but which is typically referred to as $V_{SS}$ and which typically preferably ground. However, the preferred embodiment also may be implemented wherein the lower voltage $V_{SS}$ is a potential other than ground.

The operation of flip flop 30 is now described, and with this description is an explanation of two alternative preferred embodiments that differ at least in one respect based on different values used for $V_{DD}$ and $V_{DDL}$. In either preferred embodiment, the operation of flip flop 30 is characterized in both an active mode and a standby mode. Each of these modes is described separately, below.

The active mode of operation is intended to apply to, and is entered at, those times when a mechanism outside of flip flop 30 determines that flip flop 30 should operate in the typical sense of receiving data and clocking that data from its input to the Q output. During the active mode of operation of flip flop 30, and for both the first and second preferred embodiments, $V_{DD}$ is at a nominal value, where such a value in typical contemporary circuits is on the order of 1.2 volts. In the first preferred embodiment during the active mode, $V_{DDL}$ equals $V_{DD}$. However, in the second preferred embodiment during the active mode, $V_{DDL}$ equals approximately one-half of the active mode value of $V_{DD}$ (i.e. ½*1.2 volts=0.6 volts); also, a factor other than one-half may be used where in any event $V_{DDL}$ is preferably greater than the threshold voltage of the transistors within slave circuit 42 to which $V_{DDL}$ supplies power. Also in the second embodiment, slave output node 46 is connected to a level translator circuit that increases the voltage magnitude of a logically high value from a voltage equal to $V_{DDL}$ to a voltage equal to $V_{DD}$. Such a level translator circuit is not shown in FIG. 3 so that it may generally depict both the first and second preferred embodiments, but the translator is both shown and detailed later. For both the first and second embodiments, during the active mode, the operation of flip flop 30 with respect to the transmission and storage of data through the output nodes of flip flop 30 is comparable in various respects to that described earlier in FIG. 2 with respect to flip flop 10. In this regard, in response to a first clock transition (e.g., high level of $\overline{CLK}$), data D is coupled from input 32 to master output node 38. In response to a second and opposite direction clock transition (e.g., low level of $\overline{CLK}$), data D is coupled from master output node 38 to slave output node 46, and at the same time data D is also selected by multiplexer 40 from master storage node 38 to be output at Q. Thus, at this latter transition of $\overline{CLK}$, the switching speed of multiplexer 40 determines the clock-to-Q speed of flip flop 30 which is thereby enhanced as compared to waiting for the data to pass through slave circuit 42 to slave output node 46.

The standby mode of operation for flip flop 30 is intended to apply to, and is entered at, times when a mechanism outside of flip flop 30 determines that data for a given amount of time need not propagate through flip flop 30; one skilled in the art may ascertain numerous examples of such instances, such as when an electronic device has detected a period of non-use by its user and enters a mode such as a sleep mode. With respect to specific operating details during the standby mode of operation for both preferred embodiments of flip flop 30, $V_{DD}$ is reduced to a level below $V_{DDL}$, where the reduced level of $V_{DD}$ is preferably equal to $V_{SS}$ which, in the present example, is ground. In contrast and also during the standby mode of operation for both preferred embodiments of flip flop 30, $V_{DDL}$ equals approximately one-half of the active mode value for $V_{DD}$, where again a factor other than one-half may be used so long as the standby mode value of $V_{DDL}$ is greater than the threshold voltage of the transistors within slave circuit 42 to which $V_{DDL}$ supplies power. Accordingly, recalling in the first preferred embodiment that $V_{DDL}$ equals $V_{DD}$ during the active mode, then in the standby mode for that embodiment $V_{DD}$ is reduced to $V_{SS}$ (ground) and $V_{DDL}$ is reduced to one-half of the active mode $V_{DD}$ voltage. Also, recalling in the second preferred embodiment and during the active mode that $V_{DDL}$ equals one-half of the active mode $V_{DD}$ voltage, then in the standby mode of the second preferred embodiment $V_{DDL}$ remains the same as it was during the active mode, while $V_{DD}$ is reduced to $V_{SS}$ (i.e., ground). Thus, both embodiments have in common the attribute that, during the standby mode, $V_{DDL}$ equals one-half of the active mode $V_{DD}$ voltage and $V_{DD}$ equals $V_{SS}$. Having described the changes to $V_{DD}$ (and in the first preferred embodiment, to $V_{DDL}$) in the standby mode, note further that preferably during this mode the clock signal is also disabled to master circuit 34 and slave circuit 42. As a result, $\overline{CLK}$ is left in a high state, thereby causing multiplexer 40 to select its input $40_2$ and in response causing multiplexer 40 to output at the Q output the state at slave output node 46. Moreover, also during the standby mode, preferably all transistors within master circuit 34 are not supplied a voltage across the source/drain conductive path of each transistor and, thus, the state at master output node 38 is indeterminate; however, because $V_{DDL}$ remains above the threshold voltage of the transistors to which it is connected in slave circuit 42, then the data previously stored at slave output node 46 is maintained in a valid state, and this valid state continues to be output by multiplexer 40 at the Q output. Note also that the reduction of $V_{DD}$ during the standby mode reduces the amount of leakage current that otherwise would occur if $V_{DD}$ were left in its active mode magnitude during periods of inactivity. In other words, in the standby mode, flip flop 30 maintains its logical output value indefinitely and with relatively low leakage current. Finally, when a mechanism outside of flip flop 30 determines that the active circuit mode as required, then $V_{DD}$ is increased to its active mode level, and $V_{DDL}$ is also increased for the first preferred embodiment or left alone for the second preferred embodiment. Thereafter, the clock transitions commence and normal operation returns. As a result, circuit activity may resume from the same logical state as existed when the preceding standby mode was entered.

Figure 4:
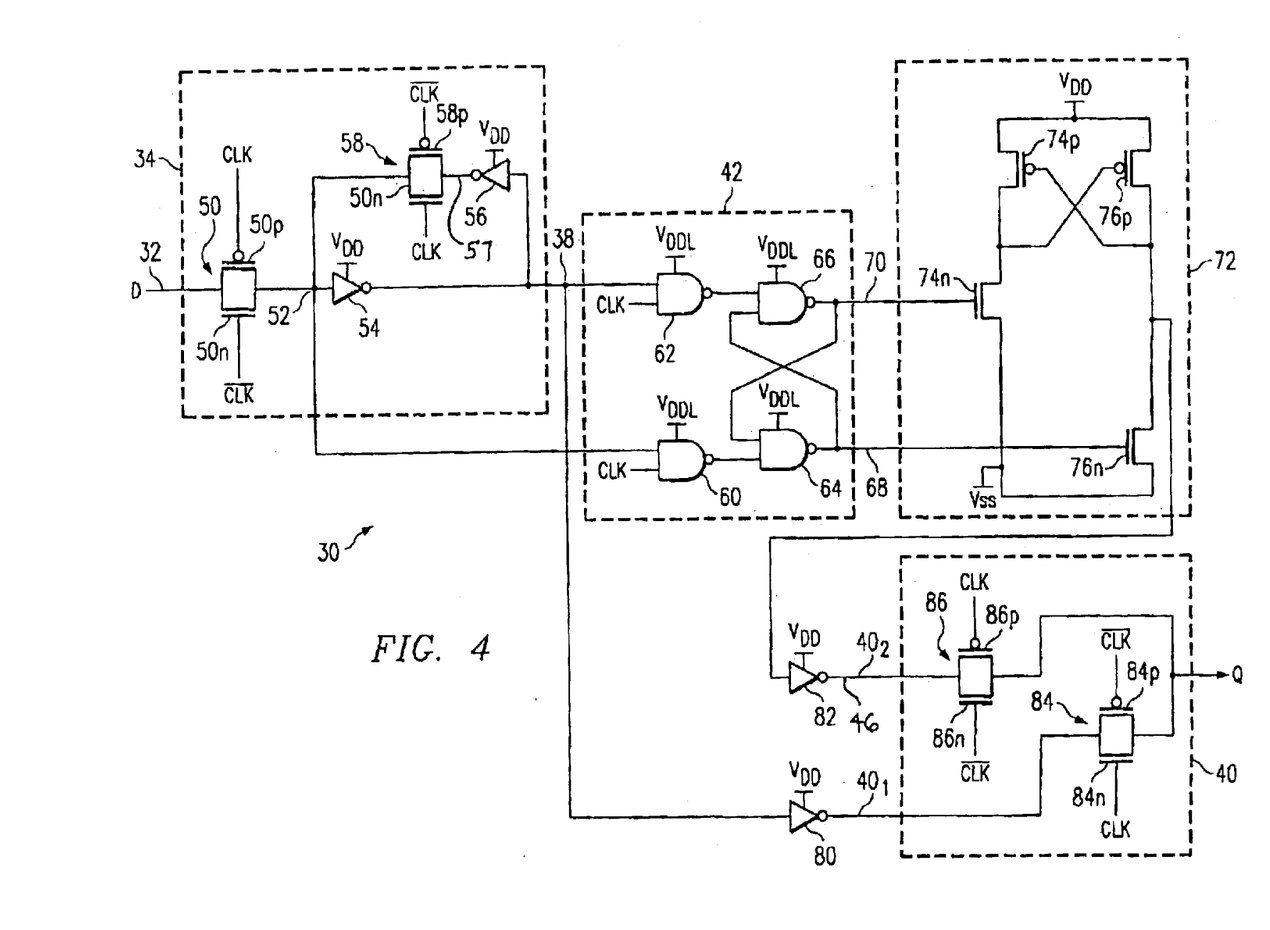
FIG. 4 illustrates a schematic of one implementation of a preferred embodiment of the flip flop in FIG. 3.

FIG. 4 illustrates a schematic of one implementation of the second preferred embodiment described above. Generally, dashed blocks are shown in the schematic and they represent master circuit 34, slave circuit 42, and multiplexer 40. A few additional inverters are included as well. Each of these devices is further described below.

Looking to the schematic within master circuit 34 in FIG. 4, data D is provided to input 32 which is connected to a transfer gate 50 which includes a p-channel transistor 50p and an n-channel transistor 50n connected with their respective source/drain paths in parallel, with a first source/drain of each transistor 50p and 50n connected to input 32 and a second source/drain of each transistor 50p and 50n connected to a node 52. Node 52 is connected as an input to an inverter 54. Inverter 54, as well as the remaining inverters shown in FIG. 4, may be constructed using various techniques ascertainable by one skilled in the art, such as by connecting a source of a p-channel transistor to a high voltage source, the drain of the p-channel transistor to a drain of an n-channel transistor, and the source of the n-channel transistor to a low voltage source. Further, the gates of the p-channel and n-channel transistors of the inverters are connected together to form the input of the inverter, while the connected drains of those transistors form the output of the inverter. Also, with respect to inverter 54 in particular, as part of master circuit 34 it receives $V_{DD}$ as its high voltage source, and for sake of simplicity its preferred low voltage source is not shown and is understood as connected to $V_{SS}$ (e.g., ground). The output of inverter 54 is connected to master output node 38, and it is also connected to an input of an inverter 56 within master circuit 34 and, hence, also powered by $V_{DD}$. The output of inverter 56 is connected to a node 57 that is further connected to a transfer gate 58. Transfer gate 58 includes a p-channel transistor 58p and an n-channel transistor 58n connected with their respective source/drain paths in parallel, with a first source/drain of each transistor 58p and 58n connected to node 57 and a second source/drain of each transistor 58p and 58n connected to node 52. Lastly, reference is made to the clocking of various devices within master circuit 34. Specifically, CLK is connected to the gate of p-channel transistor 50p and to the gate of n-channel transistor 58n, while $\overline{CLK}$ is connected to the gate of n-channel transistor 50n and to the gate of p-channel transistor 58p.

Looking to the schematic within slave circuit 42 in FIG. 4, it includes four two-input NAND gates 60, 62, 64, and 66. NAND gate 60 has one of its inputs connected to node 52 from master circuit 34 which is the value of data D once it passes through transfer gate 50, and another input of NAND gate 60 is connected to receive CLK. The output of NAND gate 60 is connected as one input to NAND gate 64. NAND gate 62 has one of its inputs connected to master output node 38 which is the value of data $\overline{D}$ once it passes through transfer gate 50 and inverter 54 (i.e., $\overline{D}$), and another input of NAND gate 62 is connected to receive CLK. The output of NAND gate 62 is connected as one input to NAND gate 66. Looking further to NAND gates 64 and 66, they are cross-coupled in that the output of each NAND gate provides an input to the other NAND gate; thus, the output of NAND gate 64 is connected to a node 68 which is connected as an input to NAND gate 66, and the output of NAND gate 66 is connected to a node 70 which is connected as an input to NAND gate 64. As demonstrated below, the signals on nodes 68 and 70 are complementary and, thus, either node may be considered to provide a slave circuit output.

Figure 5:
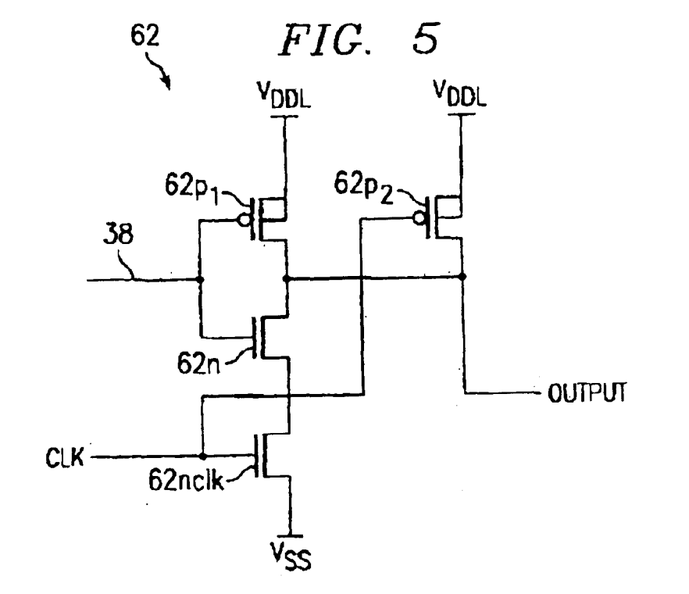
FIG. 5 illustrates a schematic of the preferred embodiment for constructing each gate in the slave circuit of FIG. 4.

Having described NAND gates 60, 62, 64, and 66 of slave circuit 42 in the second preferred embodiment, FIG. 5 illustrates a schematic of the preferred embodiment for constructing each such NAND gate, where by way of example FIG. 5 illustrates NAND gate 62. Node 38 is connected to the gate of a p-channel transistor $62p_1$, and to the gate of an n-channel transistor 62n. The source and backgate of p-channel transistor $62p_1$ are connected to $V_{DDL}$ and the drain of p-channel transistor $62p_1$ is connected to the drain of n-channel transistor 62n. NAND gate 62 also includes another p-channel transistor $62p_2$ having its source and backgate connected to $V_{DDL}$, its gate connected to receive the CLK signal, and its drain connected to the drain of p-channel transistor $62p_1$ and the drain of n-channel transistor 62n. The common drains of p-channel transistors $62p_1$, $62p_2$, and n-channel transistor 62n provide the output of NAND gate 62. The source of n-channel transistor 62n is connected to the drain of an n-channel transistor 62nclk, which is designated as such since the n-channel transistor receives the CLK signal at its gate. The source of n-channel transistor 62nCLK is connected to $V_{SS}$.

Returning briefly to FIG. 3, recall earlier it is stated that in the second embodiment of flip flop 30, slave output node 46 is connected to a level translator circuit that in the active mode increases a logically high value from a voltage equal to $V_{DDL}$ to a voltage equal to $V_{DD}$. With the specific schematic of FIG. 4, it illustrates such a level translator indicated generally at 72. Level translator 72 includes a p-channel transistor 74p with its source connected to $V_{DD}$, and it includes a p-channel transistor 76p also with its source connected to $V_{DD}$. The drains of p-channel transistors 74p and 76p are cross-connected to the opposing transistor gates, that is, the drain of p-channel transistor 74p is connected to the gate of p-channel transistor 76p, and the drain of p-channel transistor 76p is connected to the gate of p-channel transistor 74p. Further, the drains of p-channel transistors 74p and 76p are connected in series with respective n-channel transistors such that the drain of p-channel transistor 74p is connected to the drain of an n-channel transistor 74n and the drain of p-channel transistor 76p is connected to the drain of an n-channel transistor 76n. The sources of n-channel transistors 74n and 76n are connected to $V_{SS}$. Lastly, the gate of n-channel transistor 74n is connected to node 70 and the gate of n-channel transistor 76n is connected to node 68.

Continuing with FIG. 4, it also illustrates a schematic of multiplexer 40, which recall has two inputs $40_1$ and $40_2$. The first input $40_1$ is connected to the output of an inverter 80. The input of inverter 80 is connected to master output node 38, and inverter 80 is powered by $V_{DD}$. The second input $40_2$ is connected to the output of an inverter 82 and inverter 82 is powered by $V_{DD}$. The input of inverter 82 is connected to the output of level translator 72, where that output is provided by the drain of p-channel transistor 76p and the drain of n-channel transistor 76n. Also from these connections, one skilled in the art should appreciate that the output of inverter 82 corresponds to what is identified as slave output node 46 in FIG. 3, where FIG. 5 therefore necessarily illustrates the inclusion of a level translator circuit 72 in providing that output for the second preferred embodiment, and where one skilled in the art will further appreciate a comparable output from slave circuit 42, without a translator circuit, when implementing the first preferred embodiment described earlier. Input $40_1$ is connected to a transfer gate 84. Transfer gate 84 includes a p-channel transistor 84p and an n-channel transistor 84n connected with their respective source/drain paths in parallel, with a first source/drain of each transistor 84p and 84n connected to input $40_1$ and a second source/drain of each transistor 84p and 84n connected to the Q output. Similarly, input $40_2$ is connected to a transfer gate 86. Transfer gate 86 includes a p-channel transistor 86p and an n-channel transistor 86n connected with their respective source/drain paths in parallel, with a first source/drain of each transistor 86p and 86n connected to input $40_2$ and a second source/drain of each transistor 86p and 86n connected to the Q output.

Having earlier described the active mode of operation of flip flop 30, that operation may be appreciated also with respect to the schematic of FIG. 4, which is now considered first with respect to master circuit 34. When $\overline{CLK}$ is high, transfer gate 50 is enabled and D passes from input 32 to node 52, from which it is inverted by inverter 54 and thereby output as $\overline{D}$ to master output node 38. Next, when $\overline{CLK}$ is low, transfer gate 58 is enabled. Accordingly, with $\overline{D}$ at master output node 38, it is inverted by inverter 56 and passes through transfer gate 58 so that D is maintained at node 52 while $\overline{CLK}$ is low. Due to this latter operation, one skilled in the art may refer to the additional operation of inverters 54, 56, and transfer gate 58 as a latching circuit since they operate to latch data at nodes 38 and 52 once transfer gate 50 is no longer enabled (i.e., in response to $\overline{CLK}$ low).

Looking now to the operation of multiplexer 40 in FIG. 4 when $\overline{CLK}$ transitions from high to low, multiplexer 40 selects its input 40, because transfer gate 84 of multiplexer 40 is enabled (and transfer gate 86 is disabled). Thus, $\overline{D}$ at master output node 38 is inverted by inverter 80 to become D and then passes through transfer gate 84, thereby presenting D at the Q output in response to the low transition of $\overline{CLK}$.

Looking now to the operation of slave circuit 42 in FIG. 4 also when $\overline{CLK}$ transitions from high to low, during the same time that multiplexer 40 makes the selection of its input $40_1$ as described above, but with greater delay, $\overline{D}$ and D pass through slave circuit 42. Specifically, $\overline{D}$ is connected to NAND gate 62, which also receives the high value of CLK (i.e., the complement of the low $\overline{CLK}$), while D is connected to NAND gate 60, which also receives the high value of CLK. As a result, based on the state of D and $\overline{D}$, the respective complements of those signals are output by NAND gates 60 and 62, and those complements are connected to NAND gates 64 and 66, respectively. In further response, therefore, NAND gates 64 and 66 invert the signals received from NAND gates 60 and 62, respectively, and those signal are provided to level translator 72. From the preceding, therefore, it may be seen that each pair of NAND gates 62 and 66 or 60 and 64 twice complements the values from master circuit 34; thus, the output of NAND gate 66 equals $\overline{D}$ as provided from master output node 38, and the output of NAND gate 64 equals D, as provided from node 52.

Level translator 72 operates to output the same logic state as provided by the $\overline{D}$ output of NAND gate 66, with an adjustment however so that the magnitude of that value is raised from $V_{DDL}$ to $V_{DD}$ if the state is high (otherwise, it remain low at $V_{SS}$). In particular, if the $\overline{D}$ output of NAND gate 66 is high, then n-channel transistor 74n is enabled, thereby connecting the drain of that n-channel transistor 74n to $V_{SS}$ which further connects the gate of p-channel transistor 76p to $V_{SS}$ and, thus, enables p-channel transistor 76p. As a result, the magnitude of $V_{DD}$, connected to the source of the enabled p-channel transistor 76p, is output by level translator 72. Also during this time, the low complementary value of D output by NAND gate 68 does not enable n-channel transistor 76n. Conversely, if the $\overline{D}$ output of NAND gate 66 is low, then the output of NAND gate 64 is necessarily high (because it is the complement of the low output of NAND gate 66). Accordingly, the high output of NAND gate 64 enables n-channel transistor 76n, thereby connecting the drain of that n-channel transistor 76n to $V_{SS}$. As a result, the $V_{SS}$ potential, connected to the drain of the enabled n-channel transistor 76n, is output by level translator 72. Also during this lime, the low value output by NAND gate 66 does not enable n-channel transistor 74n.

Finally, consider the operation of multiplexer 40 in FIG. 4 when $\overline{CLK}$ transitions once more, that is, now from low to high. As a result, multiplexer 40 selects its input $40_2$ because transfer gate 86 of multiplexer 40 is enabled while transfer gate 84 is disabled. Thus, $\overline{D}$ at the output of level translator 72 is inverted by inverter 82 to become D and then passes through transfer gate 86, thereby presenting D at the Q output in response to the high transition of $\overline{CLK}$. Inverter 82 also serves to buffer the relatively weak current that the level translator can source or sink.

Having earlier described the standby mode of operation of flip flop 30, that operation also may be appreciated also with respect to the schematic of FIG. 4 and with less detail required as compared to the preceding discussion regarding the active mode of operation. During the standby mode, $V_{DD}$ equals $V_{SS}$ (e.g., ground), $V_{DDL}$ equals one-half of the active mode $V_{DD}$ voltage, and $\overline{CLK}$ is left in a high state (i.e., $\overline{CLK}$ off and thereby in low state). With $V_{DD}$ equal to $V_{SS}$, then no power is applied to the source/drain conductive paths of the transistors in master circuit 34, level translator 72, or inverters 80 and 82. With $V_{DDL}$ higher than the threshold voltage of the transistors in NAND gates 60, 62, 64, and 66, those devices remain operable during the standby mode. For example, returning to FIG. 5, it may be seen that $V_{DDL}$ continues to supply power to the four transistors of NAND gate 62. However, because CLK is low, n-channel transistor 62nclk is disabled while p-channel transistor $62p_2$ is enabled. Thus, the output of NAND gate 62 is connected to $V_{DDL}$ via p-channel transistor $62p_2$ and, therefore, the output is high during the standby mode. Similarly and returning to FIG. 4, the output of NAND gate 60 is also forced high by the low CLK signal. These high outputs are provided as one input to NAND gates 66 and 64, respectively. However, each of NAND gates 66 and 64 also receives as a second input the complementary pre-existing output of the other NAND gate, that is, NAND gate 66 receives as its second input the output from NAND gate 64, while NAND gate 64 receives as its second input the output from NAND gate 66. As a result, each of NAND gates 66 and 64 maintains its present output during the standby mode of operation. Moreover, when $V_{DD}$ is restored when flip flop 30 is next returned to the active mode, then level translator 72 becomes operative and the state preserved during the standby mode is then translated and available to inverter 82 and, hence, thereafter to multiplexer 40. Further, therefore, while CLK remains low and $V_{DD}$ is restored, multiplexer 40 selects its input $40_2$ and thereby outputs at the Q output the logic state which was preserved during the standby mode of operation. Accordingly, one skilled in the art should appreciate that the benefit of leakage current reduction in the standby mode is realized while still providing an acceptable clock-to-Q time for flip flop 30 as it returns to its active mode.

From the above, one skilled in the art should appreciate that flip flop 30 provides an operational flip flop during its active mode, and it maintains its stored data state in slave circuit 42 during the standby mode. In addition, during the standby mode, flip flop 30 has reduced leakage current as compared to prior art flip flops. The reduction in leakage current is achieved using at least two techniques. First, voltage is selectively disabled to selected transistors in flip flop 30, where in the preferred embodiment those portions include the master circuit 34, and they further include level translator 72 and inverters 80 and 82 connected to multiplexer 40. Second, a voltage less than the active mode $V_{DD}$ is provided to slave circuit 42. Third, note that slave circuit 42 in the preferred embodiment is not constructed in typical CMOS fashion with transmission gates, but instead it is implemented with NAND gates. NAND gates provide significant reduction in leakage over an approach with inverters and transmission gates that would be present in a typical CMOS latch. Further information on such results are provided in Models in Algorithms for Bounds on Leakage in CMOS Circuits, by Johnson et al, IEEE Transactions on Computer-Aided Design of Integrated Circuits and Systems, Vol. 18, No. 6, and which is hereby incorporated herein by reference. Lastly, slave circuit 42, being preferably implemented using NAND gates. also provides additional robustness in the low-voltage range of the circuit.

The preferred embodiments may be enhanced still further to create additional embodiments with even less leakage current by selection of appropriate sizes for the length and width of each transistor in the circuit, which by way of example is now explored in connection with the schematic of FIG. 4. Specifically, leakage current may be reduced in one transistor relative to another by increasing the length of the transistor in which reduced leakage is desired. However, a trade-off is realized in that a larger transistor length may otherwise reduce performance. Accordingly, in balancing these considerations, the following Table 1 identifies each transistor in FIG. 4 and specifies the preferred dimensions of the width/length for each such transistor. With respect to each inverter in FIG. 4, it should be understood as described earlier that each such inverter is constructed with a p-channel transistor and an n-channel transistor, and the sizes for those two transistors, for each inverter, are also shown in Table 1. Lastly, with respect to each NAND gate in FIG. 4, it should be understood that each such NAND gate is constructed in the same manner as NAND gate 62 shown in FIG. 5; thus, Table 1 below specifies the transistor sizes in NAND gate 62 with the understanding that such sizes also apply to the comparable transistors in NAND gates 60, 64, and 66.

TABLE 1

| Transistor | Size (W/L, in microns) | Transistor | Size (W/L, in microns) |
|---|---|---|---|
| 50p | 0.2/0.15 | 74p | 0.2/0.15 |
| 50n | 0.2/0.15 | 76p | 0.2/0.15 |
| inverter 54 (p-channel) | 0.5/0.15 | 74n | 0.3/0.15 |
| inverter 54 | 0.2/0.15 | 76n | 0.3/0.15 |

TABLE 1-continued

| Transistor | Size (W/L, in microns) | Transistor | Size (W/L, in microns) |
|---|---|---|---|
| (n-channel) inverter | 0.2/0.15 | inverter 80 (p-channel) | 0.5/0.15 |
| (p-channel) inverter 54 | 0.2/0.15 | inverter 80 (n-channel) | 0.2/0.15 |
| (n-channel) 58p | 0.2/0.15 | inverter 82 (p-channel) | 0.5/0.15 |
| 58n | 0.2/0.15 | inverter 82 (n-channel) | 0.2/0.15 |
| $62p_1$ | 0.2/0.2 | 84p | 0.2/0.15 |
| $62p_2$ | 0.2/0.2 | 84n | 0.2/0.15 |
| 62n | 0.2/0.2 | 86p | 0.2/0.15 |
| 62nclk | 0.2/0.2 | 86n | 0.2/0.15 |

From Table 1, it may be seen that, in the preferred embodiments, the transistor sizes for the transistors within slave circuit 42 have a length that is greater than the length for the remaining transistors in flip flop 30. As a result, current leakage is further reduced in such an embodiment.

From the above, it may be appreciated that the above embodiments provide various implementations of a flip flop having numerous advantages over the prior art. In all embodiments. there is reduced current leakage with a beneficial clock-to-Q time both during the active mode and once the flip flop returns from its standby mode to its active mode. Such results are achieved through various different circuit aspects, where such aspects may be combined into one embodiment or where various different alternatives may be created by selecting a subset of those aspects. Indeed, while the preceding has demonstrated different embodiments in detail, various additional substitutions, modifications or alterations could be made to the descriptions set forth above without departing from the inventive scope. For example, while the inclusion of a multiplexer to improve clock-to-Q time is preferred, still another embodiment may be created by implementing other of the present inventive teachings into a flip flop having a master and slave stage, with the output of the flip flop being provided only by the slave stage. As another example, while FIG. 1 illustrates the flip flop of FIG. 1 of the '852 patent and the present teachings may be used to improved that flip flop, the present teachings also may apply to the flip flop shown in FIG. 2 of the '852 patent as well as other flip flops in the art. As still another example, other current leakage reduction techniques may be implemented in combination with the use of $V_{DD}$ and $V_{DDL}$ as shown in FIG. 3. For example, transistors having a higher threshold voltage may be connected in series with the transistors described above whereby the high threshold voltage transistor is disabled during the standby mode and thereby acts as a limit on the amount of current leakage which is greater than would be provided without the high threshold voltage transistor. As another example, backgate control could be used to reduce the current leakage of certain transistors within the flip flop. Still other alternatives may be ascertained by one skilled in the art. Thus, the preceding embodiments and variations thereof further serve to demonstrate the inventive scope, as is ultimately defined by the following claims.

What is claimed is:

1. A flip flop, comprising:
   a master stage comprising a first plurality of transistors, wherein each of the first plurality of transistors comprises a selective conductive path between a source and a drain;
   a slave stage comprising a second plurality of transistors, wherein each of the second plurality of transistors comprises a selective conductive path between a source and a drain and wherein the slave stage comprises a plurality of NAND gates; and
   wherein in a low power mode the flip flop is operable to receive a first voltage coupled to the selective conductive path for each of the first plurality of transistors;
   wherein in the low power mode the flip flop is operable to receive a second voltage coupled to the selective conductive path for each of the second plurality of transistors; and
   wherein the second voltage is greater than the first voltage in the low power mode.

2. The flip flop of claim 1 wherein the second voltage exceeds a threshold voltage for each of the second plurality of transistors.

3. The flip flop of claim 1:
   wherein in an active mode the slave stage is operable to output a digital state at a slave output node; and
   wherein the second voltage is sufficient to maintain the digital state at the slave output node during the low power mode.

4. The flip flop of claim 1 wherein in an active mode the first voltage equals the second voltage.

5. The flip flop of claim 1 wherein in an active mode the first voltage exceeds the second voltage.

6. The flip flop of claim 5 wherein in the active mode the slave stage is operable to store a digital state at a slave output node, the digital state comprising either a logic low or a logic high;
   and further comprising a level translator coupled to the slave output node for receiving the logic high at the first voltage at the slave output node and for providing at a level translated output node a corresponding logic high at the second voltage.

7. The flip flop of claim 1 wherein in an active mode the second voltage equals approximately one-half of the first voltage.

8. The flip flop of claim 1:
   wherein in an active mode the master stage is operable to store a digital state at a master output node in response to a first clock transition;
   wherein in the active mode the slave stage is operable to store a digital state at a slave output node in response to a second clock transition;
   and further comprising a multiplexer having a first input coupled to the master output node and a second input coupled to the slave output node;
   wherein the multiplexer is operable to output the digital state stored at the master output node in response to the first clock transition; and
   wherein the multiplexer is operable to output the digital state stored at the slave output node in response to the second clock transition.

9. The flip flop of claim 8:
   wherein the first input is coupled to the master output node through a first inverter; and
   wherein the second input is coupled to the slave output node through a second inverter.

10. The flip flop of claim 1:
    wherein the plurality of NAND gates comprise the second plurality of transistors; and
    wherein a length of each of the second plurality of transistors is greater than a length of each of the first plurality of transistors.

11. The flip flop of claim 10:
wherein the master stage comprises:
an input coupled to a transfer gate, the transfer gate for outputting data received at the input to a first master node; and
a latching circuit coupled to the first master node, the latching circuit for outputting data received at the first master node to a master output node; and
wherein the plurality of NAND gates comprise:
a first NAND gate having a first input connected to the master output node and a second input connected to receive a clock signal;
a second NAND gate having a first input connected to the first master node and a second input connected to receive the clock signal;
a third NAND gate having a first input connected to an output of the first NAND gate;
a fourth NAND gate having a first input connected to an output of the second NAND gate, a second input connected to an output of the third NAND gate, and an output connected to a second input of the third NAND gate.

12. The flip flop of claim 1:
wherein the master stage comprises:
an input coupled to a transfer gate, the transfer gate for outputting data received at the input to a first master node; and
a latching circuit coupled to the first master node, the latching circuit for outputting data received at the first master node to a master output node; and
wherein the plurality of NAND gates comprise:
a first NAND gate having a first input connected to the master output node and a second input connected to receive a clock signal,
a second NAND gate having a first input connected to the first master node and a second input connected to receive the clock signal;
a third NAND gate having a first input connected to an output of the first NAND gate;
a fourth NAND gate having a first input connected to an output of the second NAND gate, a second input connected to an output of the third NAND gate, and an output connected to a second input of the third NAND gate.

13. The flip flop of claim 1 wherein in the low power mode the first voltage equals ground.

14. The flip flop of claim 1 wherein the second plurality of transistors comprises a first set of transistors having a first threshold voltage and a second set of transistors having a second threshold voltage.

15. The flip flop of claim 1 wherein at least some of the second plurality of transistors comprise a back gate control voltage for reducing current leakage during the low power mode.

16. A flip flop, comprising:
a master stage comprising a first plurality of transistors, wherein each of the first plurality of transistors comprises a selective conductive path between a source and a drain;
a slave stage comprising a second plurality of transistors, wherein each of the second plurality of transistors comprises a selective conductive path between a source and a drain; and
wherein in a low power mode the flip flop is operable to receive a first voltage coupled to the selective conductive path for each of the first plurality of transistors;
wherein in the low power mode the flip flop is operable to receive a second voltage coupled to the selective conductive path for each of the second plurality of transistors;
wherein the second voltage is greater than the first voltage and exceeds a threshold voltage for each of the second plurality of transistors;
wherein in an active mode the master stage is operable to store a digital state at a master output node in response to a first clock transition;
wherein in the active mode the slave stage is operable to store a digital state at a slave output node in response to a second clock transition;
and further comprising a multiplexer having a first input coupled to the master output node and a second input coupled to the slave output node;
wherein the multiplexer is operable to output the digital state stored at the master output node in response to the first clock transition; and
wherein the multiplexer is operable to output the digital state stored at the slave output node in response to the second clock transition.

17. The flip flop of claim 16 wherein the slave stage comprises a plurality of NAND gates.

18. The flip flop of claim 17:
wherein the plurality of NAND gates comprise the second plurality of transistors; and
wherein a length of each of the second plurality of transistors is greater than a length of each of the first plurality of transistors.

19. A method of operating flip flop, the flip flop comprising a master stage comprising a first plurality of transistors, wherein each of the first plurality of transistors comprises a selective conductive path between a source and a drain and the flip flop further comprising a slave stage comprising a second plurality of transistors, wherein each of the second plurality of transistors comprises a selective conductive path between a source and a drain, the method comprising the steps of:
in a low power mode of the flip flop, coupling a first voltage coupled to the selective conductive path for each of the first plurality of transistors; and
in the low power mode of the flip flop, coupling a second voltage coupled to the selective conductive path for each of the second plurality of transistors; and
wherein the second voltage is greater than the first voltage; and
wherein in an active mode the master stage operates to store a digital state at a master output node in response to a first clock transition;
wherein in the active mode the slave stage operates to store a digital state at a slave output node in response to a second clock transition;
and further comprising operating a multiplexer having a first input coupled to the master output node and a second input coupled to the slave output node;
wherein the multiplexer operates to output the digital state stored at the master output node in response to the first clock transition; and
wherein the multiplexer operates to output the digital state stored at the slave output node in response to the second clock transition.

20. The method of claim 19 wherein the second voltage exceeds a threshold voltage for each of the second plurality of transistors.

21. The method of claim 19:
wherein in an active mode the slave stage operates to output a digital state at a slave output node; and
wherein the second voltage is sufficient to maintain the digital state at the slave output node during the low power mode.

22. The method of claim 19 wherein in an active mode the first voltage equals the second voltage.

23. The method of claim 19 wherein in an active mode the first voltage exceeds the second voltage.

24. The method of claim 23 wherein in the active mode the slave stage operates to store a digital state at a slave output node, the digital state comprising either a logic low or a logic high;
and further comprising operating a level translator coupled to the slave output node to receive the logic high at the first voltage at the slave output node and to provide at a level translated output node a corresponding logic high at the second voltage.

25. The method of claim 19 wherein in an active mode the second voltage equals approximately one-half of the first voltage.

26. A flip flop, comprising:
a master stage comprising a first plurality of transistors, wherein each of the first plurality of transistors comprises a selective conductive path between a source and a drain;
a slave stage comprising a second plurality of transistors, wherein each of the second plurality of transistors comprises a selective conductive path between a source and a drain;
wherein in a low power mode the flip flop is operable to receive a first voltage coupled to the selective conductive path for each of the first plurality of transistors;
wherein in the low power mode the flip flop is operable to receive a second voltage coupled to the selective conductive path for each of the second plurality of transistors; and
wherein the second voltage is greater than the first voltage in the low power mode;
wherein in an active mode the master stage is operable to store a digital state at a master output node in response to a first clock transition;
wherein in the active mode the slave stage is operable to store a digital state at a slave output node in response to a second clock transition;
and further comprising a multiplexer having a first input coupled to the master output node and a second input coupled to the slave output node;
wherein the multiplexer is operable to output the digital state stored at the master output node in response to the first clock transition; and
wherein the multiplexer is operable to output the digital state stored at the slave output node in response to the second clock transition.

27. A flip flop, comprising:
a master stage comprising a first plurality of transistors, wherein each of the first plurality of transistors comprises a selective conductive path between a source and a drain;
a slave stage comprising a second plurality of transistors, wherein each of the second plurality of transistors comprises a selective conductive path between a source and a drain; and wherein in a low power mode the flip flop is operable to receive a first voltage coupled to the selective conductive path for each of the first plurality of transistors;
wherein in the low power mode the flip flop is operable to receive a second voltage coupled to the selective conductive path for each of the second plurality of transistors;
wherein the second voltage is greater than the first voltage in the low power mode; and
wherein at least some of the second plurality of transistors comprise a back gate control voltage for reducing current leakage during the low power mode.

28. The flip flop of claim 27 wherein the second voltage exceeds a threshold voltage for each of the second plurality of transistors.

29. The flip flop of claim 27:
wherein in an active mode the slave stage is operable to output a digital state at a slave output node; and
wherein the second voltage is sufficient to maintain the digital state at the slave output node during the low power mode.

30. The flip flop of claim 27 wherein in an active mode the first voltage equals the second voltage.

31. The flip flop of claim 27 wherein in an active mode the first voltage exceeds the second voltage.

32. The flip flop of claim 31 wherein in the active mode the slave stage is operable to store a digital state at a slave output node, the digital state comprising either a logic low or a logic high;
and further comprising a level translator coupled to the slave output node for receiving the logic high at the first voltage at the slave output node and for providing at a level translated output node a corresponding logic high at the second voltage.

33. The flip flop of claim 27 wherein in an active mode the second voltage equals approximately one-half of the first voltage.

34. The flip flop of claim 27:
wherein in an active mode the master stage is operable to store a digital state at a master output node in response to a first clock transition;
wherein in the active mode the slave stage is operable to store a digital state at a slave output node in response to a second clock transition;
and further comprising a multiplexer having a first input coupled to the master output node and a second input coupled to the slave output node;
wherein the multiplexer is operable to output the digital state stored at the master output node in response to the first clock transition; and
wherein the multiplexer is operable to output the digital state stored at the slave output node in response to the second clock transition.

35. The flip flop of claim 34:
wherein the first input is coupled to the master output node through a first inverter; and
wherein the second input is coupled to the slave output node through a second inverter.

36. The flip flop of claim 27 wherein the slave stage comprises a plurality of NAND gates.

37. The flip flop of claim 36:
wherein the plurality of NAND gates comprise the second plurality of transistors; and
wherein a length of each of the second plurality of transistors is greater than a length of each of the first plurality of transistors.

38. The flip flop of claim 37:

wherein the master stage comprises:
- an input coupled to a transfer gate, the transfer gate for outputting data received at the input to a first master node; and
- a latching circuit coupled to the first master node, the latching circuit for outputting data received at the first master node to a master output node; and wherein the plurality of NAND gates comprise:
- a first NAND gate having a first input connected to the master output node and a second input connected to receive a clock signal;
- a second NAND gate having a first input connected to the first master node and a second input connected to receive the clock signal;
- a third NAND gate having a first input connected to an output of the first NAND gate;
- a fourth NAND gate having a first input connected to an output of the second NAND gate, a second input connected to an output of the third NAND gate, and an output connected to a second input of the third NAND gate.

39. The flip flop of claim 36:

wherein the master stage comprises:
- an input coupled to a transfer gate, the transfer gate for outputting data received at the input to a first master node; and
- a latching circuit coupled to the first master node, the latching circuit for outputting data received at the first waster node to a waster output node; and wherein the plurality of NAND gates comprise:
- a first NAND gate having a first input connected to the master output node and a second input connected to receive a clack signal;
- a second NAND gate having a first input connected to the first master node and a second input connected to receive the clock signal;
- a third NAND gate having a first input connected to an output of the first NAND gate;
- a fourth NAND gate having a first input connected to an output of the second NAND gate, a second input connected to an output of the third NAND gate, and an output connected to a second input of the third NAND gate.

40. The flip flop of claim 27 wherein in the low power mode the first voltage equals ground.

41. The flip flop of claim 27 wherein the second plurality of transistors comprises a first set of transistors having a first threshold voltage and a second set of transistors having a second threshold voltage.

42. A method of operating flip flop, the flip flop comprising a master stage comprising a first plurality of transistors, wherein each of the first plurality of transistors comprises a selective conductive path between a source and a drain and the flip flop further comprising a slave stage comprising a second plurality of transistors, wherein each of the second plurality of transistors comprises a selective conductive path between a source and a drain, the method comprising the steps of:

- In a low power mode of the flip flop, coupling a first voltage coupled to the selective conductive path for each of the first plurality of transistors; and
- in the low power mode of the flip flop, coupling a second voltage coupled to the selective conductive path for each of the second plurality of transistors; and
- wherein the second voltage is greater than the first voltage; and
- wherein in an active mode the second voltage equals approximately one-half of the first voltage.

43. A method of operating flip flop, the flip flop comprising a master stage comprising a first plurality of transistors, wherein each of the first plurality of transistors comprises a selective conductive path between a source and a drain and the flip flop further comprising a slave stage comprising a second plurality of transistors, wherein each of the second plurality of transistors comprises a selective conductive path between a source and a drain, the method comprising the steps of:

- in a low power mode of the flip flop, coupling a first voltage coupled to the selective conductive path for each of the first plurality of transistors; and
- in the low power mode of the flip flop, coupling a second voltage coupled to the selective conductive path for each of the second plurality of transistors; and
- wherein the second voltage is greater than the first voltage; and
- wherein in an active mode the first voltage exceeds the second voltage.

44. The method of claim 43 wherein in the active mode the slave stage operates to store a digital state at a slave output node, the digital state comprising either a logic low or a logic high;

and further comprising operating a level translator coupled to the slave output node to receive the logic high at the first voltage at the slave output node and to provide at a level translated output node a corresponding logic high at the second voltage.

* * * * *